(12) United States Patent
Choo et al.

(10) Patent No.: US 8,884,295 B2
(45) Date of Patent: Nov. 11, 2014

(54) THIN FILM TRANSISTOR INCLUDING AN ACTIVE LAYER PATTERN, METHOD OF MANUFACTURING THE SAME, AND ORGANIC LIGHT EMITTING DISPLAY APPARATUS

(75) Inventors: Byoung-Kwon Choo, Yongin (KR); Hyun-Been Hwang, Yongin (KR); Kwon-Hyung Lee, Yongin (KR); Cheol-Ho Park, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 191 days.

(21) Appl. No.: 13/462,189

(22) Filed: May 2, 2012

(65) Prior Publication Data

US 2012/0299000 A1 Nov. 29, 2012

(30) Foreign Application Priority Data

May 26, 2011 (KR) .................. 10-2011-0050186

(51) Int. Cl.
 *H01L 29/04* (2006.01)
 *H01L 29/786* (2006.01)
 *H01L 27/12* (2006.01)
(52) U.S. Cl.
 CPC .... *H01L 29/78696* (2013.01); *H01L 29/78645* (2013.01); *H01L 27/1296* (2013.01)
 USPC .......... 257/64; 257/66; 257/72; 257/E33.053; 438/166; 438/158

(58) Field of Classification Search
 CPC ............ H01L 29/786; H01L 29/78696; H01L 29/78672; H01L 29/78675; H01L 29/78678
 USPC ............. 257/57, 59, 64, 66, 72, 75, E33.053, 257/E29.273, E29.292, E29.293, E29.294, 257/E21.409, E21.414; 438/158, 166
 See application file for complete search history.

(56) References Cited

U.S. PATENT DOCUMENTS

| | | | |
|---|---|---|---|
| 6,184,559 B1 * | 2/2001 | Hayakawa et al. | 257/401 |
| 6,265,290 B1 * | 7/2001 | Moon et al. | 438/505 |
| 6,566,173 B1 | 5/2003 | Choi | |
| 6,602,744 B1 | 8/2003 | Ino et al. | |
| 6,933,526 B2 * | 8/2005 | So | 257/59 |
| 7,247,880 B2 | 7/2007 | Park et al. | |
| 2004/0207582 A1 * | 10/2004 | Koo et al. | 345/82 |

FOREIGN PATENT DOCUMENTS

| | | |
|---|---|---|
| JP | 10-12891 | 1/1998 |
| KR | 10-2000-0028541 A | 5/2000 |
| KR | 10-2000-0060685 A | 10/2000 |
| KR | 10-2006-0003706 A | 1/2006 |

* cited by examiner

*Primary Examiner* — Tucker Wright
(74) *Attorney, Agent, or Firm* — Lee & Morse, P.C.

(57) ABSTRACT

A thin film transistor (TFT) having an active layer pattern, the active layer pattern including a first active layer pattern extending in a first direction; a second active layer pattern extending in the first direction and parallel to the first active layer pattern; and a third active layer pattern connecting a first end of the first active layer pattern to a first end of the second active layer pattern.

23 Claims, 14 Drawing Sheets

FIG. 11A

| DISPERSION MEASURING LOCATION | P1 | P2 | P3 | P4 | P5 | P6 | AVERAGE | STANDARD DEVIATION |
|---|---|---|---|---|---|---|---|---|
| COMPARISON EXAMPLE | 0.033 | 0.094 | 0.052 | 0.077 | 0.078 | 0.014 | 0.058 | 0.031 |
| EMBODIMENT OF THE PRESENT INVENTION | 0.048 | 0.033 | 0.054 | 0.058 | 0.043 | 0.041 | 0.046 | 0.009 |

THIN FILM TRANSISTOR INCLUDING AN ACTIVE LAYER PATTERN, METHOD OF MANUFACTURING THE SAME, AND ORGANIC LIGHT EMITTING DISPLAY APPARATUS

CROSS-REFERENCE TO RELATED PATENT APPLICATION

This application claims the benefit of Korean Patent Application No. 10-2011-0050186, filed on May 26, 2011, in the Korean Intellectual Property Office, the disclosure of which is incorporated herein in its entirety by reference.

BACKGROUND

1. Field of the Invention

Embodiments relate to a thin film transistor (TFT), a method of manufacturing the same, and an organic light emitting display apparatus.

2. Description of the Related Art

Active matrix (AM) type organic light emitting display apparatus includes a pixel circuit in each pixel, wherein the pixel circuit includes a thin film transistor (TFT) including silicon. Examples of the silicon forming the TFT may include amorphous silicon and polycrystalline silicon.

An amorphous silicon (a-Si) TFT used in the pixel circuit has low electron mobility of less than or equal to 1 $cm^2/Vs$ since a semiconductor active layer constituting a source, a drain, and a channel includes amorphous silicon. In this regard, currently, the a-Si TFT is replaced with polycrystalline silicon (poly-Si) TFT. The poly-Si TFT has greater electron mobility than that of the a-Si TFT and has excellent stability for light irradiation. Accordingly, the poly-Si TFT is appropriate to drive an AM type organic light emitting display apparatus and/or to be used as an active layer of a switching TFT.

The poly-Si TFT may be manufactured using various methods including directly depositing polycrystalline silicon, and depositing and then crystallizing amorphous silicon.

Examples of directly depositing polycrystalline silicon include chemical vapor deposition (CVD), photo CVD, hydrogen radical (HR) CVD, electron cyclotron resonance (ECR) CVD, plasma enhanced (PE) CVD, and low pressure (LP) CVD.

Examples of depositing and then crystallizing amorphous silicon include solid phase crystallization (SPC), excimer laser crystallization (ELC), metal induced crystallization (MIC), metal induced lateral crystallization (MILC), and sequential lateral solidification (SLS).

SUMMARY

One or more embodiments may provide thin film transistor (TFT) including an active layer pattern, wherein the active layer pattern may include a first active layer pattern extending in a first direction; a second active layer pattern extending in the first direction and parallel to the first active layer pattern; and a third active layer pattern connecting a first end of the first active layer pattern to a first end of the second active layer pattern.

The TFT may further include a gate electrode extending in a second direction that is perpendicular to the first direction, the gate electrode intersecting the first active layer pattern and the second active layer pattern; and a gate insulating layer interposed between the active layer pattern and the gate electrode.

The active layer pattern may include a plurality of linear grain boundaries extending in a third direction and adjacent grain boundaries have a gap therebetween corresponding to a scan pitch.

The first direction may be a direction parallel to the third direction and the second direction may be a direction perpendicular to the third direction. The first direction may be a direction perpendicular to the third direction and the second direction may be a direction parallel to the third direction. The first direction may extend at an angle "a" relative to the third direction, "a" satisfying the relation $0° < a \leq 45°$. Widths of the first active layer pattern and the second active layer pattern may be each longer than the scan pitch. Gaps between the first active layer pattern and the second active layer pattern may be the same as the scan pitch or are an integer time of the scan pitch.

The first active layer pattern may include a plurality of first active layer patterns, the second active layer pattern may include a plurality of second active layer patterns, and the third active layer pattern may include a plurality of third active layer patterns, each of the third active layer patterns connecting the first end of the first active layer patterns to the first end of one adjacent second active layer pattern, the active layer pattern may further include a fourth active layer pattern, the fourth active layer pattern connecting a second end of the first active layer patterns to a second end of another adjacent second active layer pattern.

The TFT may further include a gate electrode extending in the second direction and intersecting the plurality of first active layer patterns and the plurality of second active layer patterns; and a gate insulating layer interposed between the active layer pattern and the gate electrode.

The active layer pattern may be crystallized by using at least one selected from the group consisting of rapid thermal annealing (RTA), solid phase crystallization (SPC), excimer laser annealing (ELA), metal induced crystallization (MIC), metal induced lateral crystallization (MILC), sequential lateral solidification (SLS), and advanced sequential lateral solidification (ASLS).

One or more embodiments may provide an organic light emitting display apparatus including an organic light emitting diode for emitting light by receiving a driving current; and a plurality of pixels having a driving transistor for generating the driving current in response to a data signal, wherein an active layer pattern of the driving transistor includes a first active layer pattern extending in a first direction; a second active layer pattern extending in the first direction and parallel to the first active layer pattern; and a third active layer pattern connect a first end of the first active layer pattern to a first end of the second active layer pattern.

The driving transistor may include a gate electrode extending in a second direction that is perpendicular to the first direction and intersecting the first active layer pattern and the second active layer pattern; and a gate insulating layer interposed between the active layer pattern and the gate electrode.

The active layer pattern may include a plurality of linear grain boundaries extending in the third direction, and adjacent grain boundaries have a gap therebetween, the gap corresponding to a scan pitch. Widths of the first active layer pattern and the second active layer pattern may be each longer than the scan pitch. Gaps between the first active layer pattern and the second active layer pattern may be the same as the scan pitch or are an integer time of the scan pitch.

The first active layer pattern may include a plurality of first active layer patters, the second active layer pattern may include a plurality of second active layer patterns, the third active layer pattern may include a plurality of third active layer patterns, each of the third active layer patterns connecting the first end of the first active layer patterns to the first end of one adjacent second active layer pattern, and the active layer pattern may further include a fourth active layer pattern, the fourth active layer pattern connecting a second end of the first active layer patterns to a second end of another adjacent second active layer pattern.

The driving transistor may include a gate electrode extending in the second direction and intersecting the plurality of first active layer patterns and the plurality of second active layer patterns; and a gate insulating layer interposed between the active layer pattern and the gate electrode.

One or more embodiments may provide a method of manufacturing a thin film transistor (TFT) including forming a semiconductor layer; forming a first active layer pattern extending in a first direction on the semiconductor layer; forming a second active layer pattern extending in the first direction and parallel to the first active layer pattern; and a third active layer pattern connecting a first end of the first active layer pattern to a first end of the second active layer pattern The method may further include forming a gate insulating layer on the first, second, and third active layer patterns; and forming a gate electrode extending in a second direction that is perpendicular to the first direction and intersecting the first active layer pattern and the second active layer pattern on the gate insulating layer.

The method may further include crystallizing the semiconductor layer before or after forming of the first, second, and third active layer patterns, wherein the semiconductor layer may include a plurality of linear grain boundaries extending in a third direction, and adjacent grain boundaries have a gap therebetween, the gap corresponding to a scan pitch. Widths of the first active layer pattern and the second active layer pattern may be each longer than the scan pitch. Gaps between the first active layer pattern and the second active layer pattern may be the same as the scan pitch or are an integer time of the scan pitch.

The method may further include forming the first, second, and third active layer patterns, wherein forming the first active layer pattern, the second active layer pattern, and the third active layer pattern may include forming a plurality of the first, second, and third active layer patterns, and each of the third active layer patterns connects the first end of the first active layer patterns to the first end of one adjacent second active layer pattern, and the fourth active layer pattern connects a second end of the first active layer pattern to a second end of another adjacent second active layer pattern.

The method may further include forming a gate insulating layer on the first, second, third, and fourth active layer patterns; and forming a gate electrode extending in the second direction and intersecting the plurality of first active layer patterns and second active layer patterns on the gate insulating layer.

The method may further include forming a gate electrode extending in a second direction that is perpendicular to the first direction on the substrate; and forming a gate insulating layer on the gate electrode, wherein forming the semiconductor layer may include forming the semiconductor layer on the gate insulating layer and forming the gate electrode to intersect the first active layer pattern and the second active layer pattern.

BRIEF DESCRIPTION OF THE DRAWINGS

The above and other features and advantages of the embodiments will become more apparent by describing in detail exemplary embodiments thereof with reference to the attached drawings in which:

FIGS. 11A and 11B illustrate at table and a graph, respectively, including data relating to dispersion improvement effect according to embodiments.

DETAILED DESCRIPTION

The description and the accompanying drawings are illustrated to understand operations of the embodiments and the detailed descriptions of well-known technologies by one of ordinary skill in the art may be omitted.

Also, the specification and drawings are not intended to be limiting of exemplary embodiments. The terminology used herein should be construed having meaning and concept appropriate to a technical idea of the embodiments so as to appropriately express the embodiments.

Hereinafter, one or more embodiments will be described in detail with reference to the accompanying drawings.

Figure 1A:
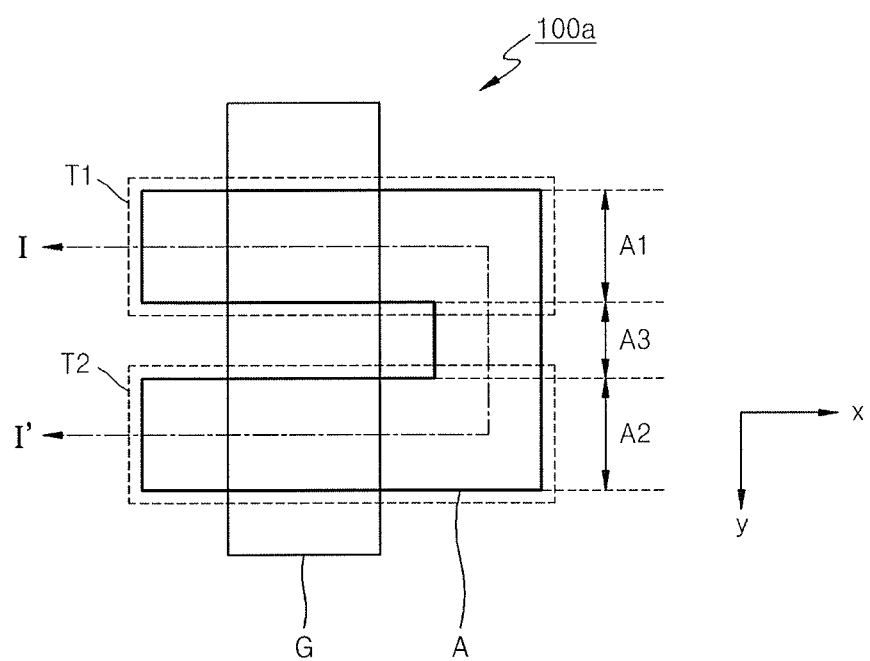
FIGS. 1A and 1B illustrate plan views of a gate electrode G and an active layer pattern A of a thin film transistor (TFT) according to embodiments.
Figure 1B:
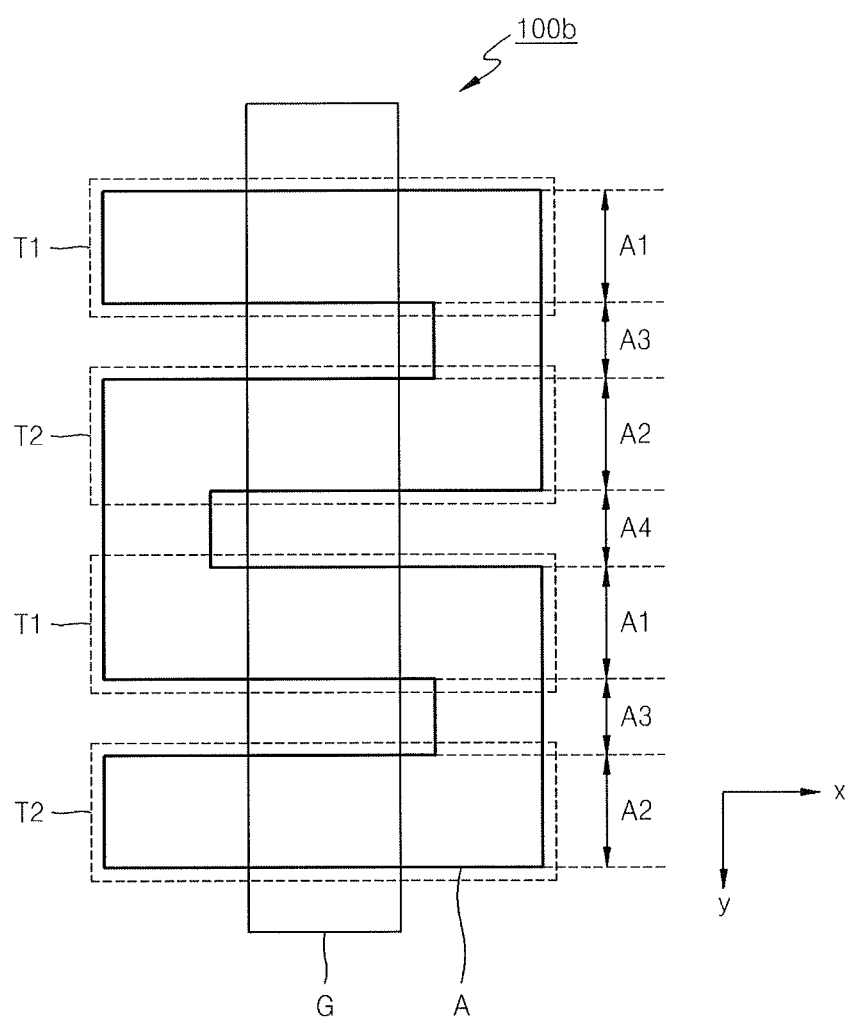

FIGS. 1A and 1B illustrate plan views of a gate electrode G and an active layer pattern A of thin film transistors (TFT) 100a and 100b according to embodiments.

As illustrated in FIG. 1A, the TFT 100a according to the current embodiment may include the active layer pattern A and the gate electrode G formed to cross the active layer pattern A.

The active layer pattern A, according to the current embodiment, may include a first active layer pattern A1, a second active layer pattern A2, and a third active layer pattern A3. The first active layer pattern A1 and the second active layer pattern A2 may extend in a first direction x and may be formed to be parallel with each other. The first active layer pattern A1 and the second active layer pattern A2 may each include a channel area at an area corresponding to the gate electrode G and may each include source/drain areas contacting source/drain electrodes at both ends other than the channel areas. For example, the channel areas of the first active layer pattern A1 and the second active layer pattern A2 may not contact the source/drain electrodes of the first active layer pattern A1 and the second active layer pattern A2, respectively. The source/drain areas may be formed by doping with a higher concentration of impurities than the channel area so that the source/drain electrodes (e.g., ohmic) may contact the source/drain areas.

The third active layer pattern A3 may extend in a second direction y between a first end of the first active layer pattern A1 and a first end of the second active layer pattern A2. The third active layer pattern A3 may be formed to form a current path between the first active layer pattern A1 and the second active layer pattern A2. Accordingly, the third active layer pattern A3 may be doped with a high concentration of impurities, similar to the source/drain areas of the first active layer pattern A1 and the second active layer pattern A2.

The gate electrode G may extend in the second direction y that is perpendicular to the first direction x and may intersect the first active layer pattern A1 and the second active layer pattern A2. The gate electrode G may be formed as a top gate type or a bottom gate type.

The TFT 100a may have a bent active pattern A, and the gate electrode G may intersect the bent active pattern A so that a property dispersion of the TFT 100a may be significantly reduced. The active layer pattern A may be formed by depositing a semiconductor layer on a substrate, patterning the semiconductor layer according to the active layer pattern A, and crystallizing the semiconductor layer. According to some embodiments, the semiconductor layer may first be patterned, and then crystallized. According to some embodiments, the semiconductor layer may first be crystallized and then patterned. However, in the crystallization process, a property dispersion may be generated in the semiconductor layer. For example, when the semiconductor layer is crystallized by using sequential lateral solidification (SLS), a periodic striped main grain boundary may be generated. Various defects may exist in the main grain boundary, which may reduce carrier mobility of the TFT 100a. Accordingly, the property of the TFT 100a, which is crystallized, may be changed according to the existence of the main grain boundary. Thus, a property dispersion may be generated. According to one or more embodiments, the active layer pattern A may be bent. A property dispersion of a plurality of TFTs 100a may be significantly reduced by the active layer pattern A, according to one or more embodiments.

FIGS. 2A through 2D illustrate equivalent circuit diagrams of TFTs 100a, 100b, 100c, and 100d, according to embodiments.

As illustrated in FIGS. 2A through 2D, the TFTs 100a, 100b, 100c, and 100d, according to the current embodiments may each have a structure in which a plurality of transistors are connected in series. The number of the plurality of transistors may be an even number. According to an embodiment, the plurality of transistors may include one or more of a first transistor T1 and a second transistor T2. The one or more first and second transistor T1 and T2 may be alternately arranged. A drain/source electrode of the first transistor T1 may be connected to a source/drain electrode of the second transistor T2. The first transistor T1 may include the first active layer pattern A1 of FIG. 1A and a portion of the gate electrode G which overlaps the first active layer pattern A1. The second transistor T2 may include the second active layer pattern A2 of FIG. 1A and a portion of the gate electrode G which overlaps the second active layer pattern A2. Also, the first transistor T1 and the second transistor T2 may be electrically connected to each other by the third active layer pattern A3 of FIG. 1A. As the number of the first transistors T1 and the second transistors T2, which are connected in series, increases, the dispersion effect may improve.

Figure 2A:
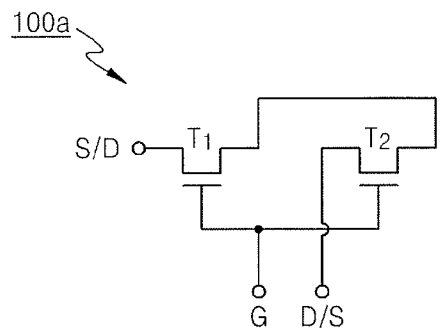
FIGS. 2A through 2D illustrate equivalent circuit diagrams of TFTs according to embodiments.
Figure 2B:
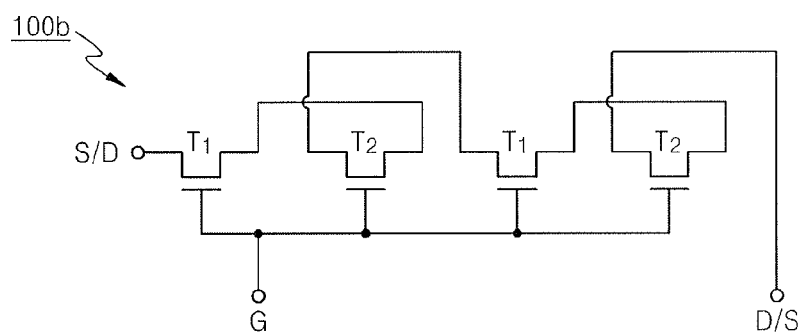
Figure 2C:
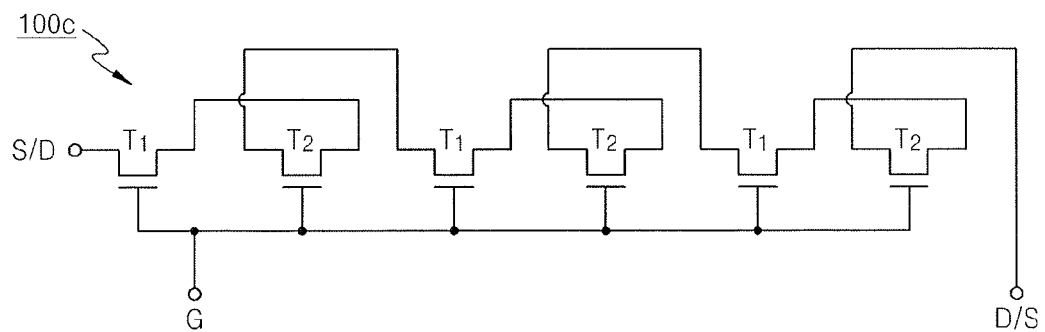
Figure 2D:
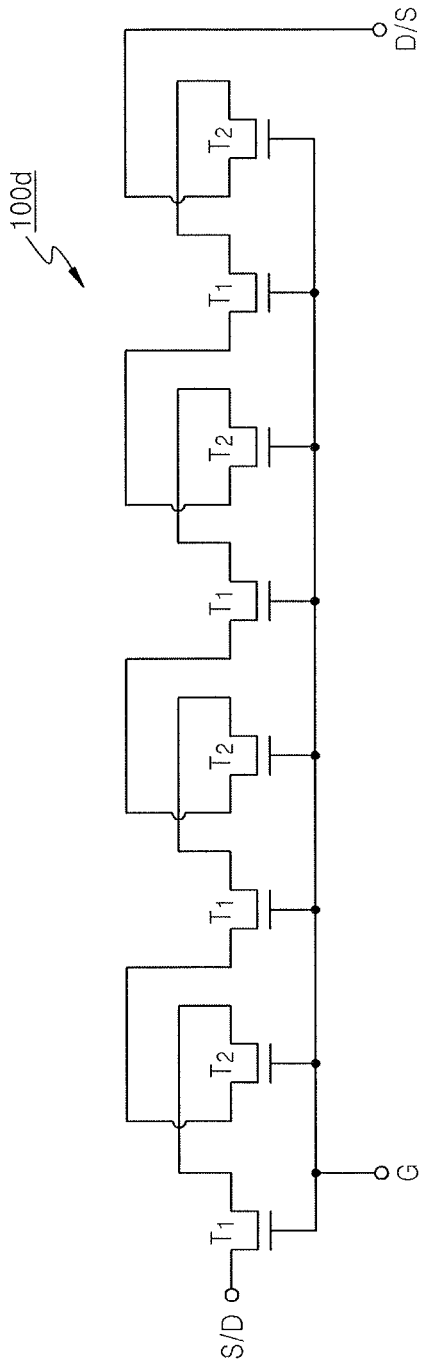

FIG. 1B illustrates a plan view of a gate electrode G and an active layer pattern A of a TFT 100F corresponding to FIG. 2B.

As illustrated in FIG. 1B, in a structure of FIG. 2B, the first active layer pattern A1 and the second active layer pattern A2 may extend in the first direction x and may be configured to be parallel with each other. The first active layer pattern A1 and the second active layer pattern A2 may be repeated in the second direction y. For example, a plurality of first active layer patterns A1 and second active layer patterns A2 may be provided, which are vertically aligned with respect to each other. The second active layer pattern A2 and the next first active layer pattern A1 may be connected to each other at the other end, e.g., opposing, second end, by a fourth active layer pattern A4, and the next first active layer pattern A1 and the next second active layer pattern A2 may be connected to each other at one end by the third active layer pattern A1. For example, each of the first active layer patterns A1 may be connected at a first end to a first end of one of the second active layer patterns A2 by the third active layer pattern A3. Each of the first active layer patterns A1 may be connected at a second end to a second end of another one of the second active layer patterns A2 by a fourth active layer pattern A4. The gate electrode G may extend in the second direction y and, thereby, intersect the first active layer patterns A1 and the second active layer patterns A2.

Figure 3:
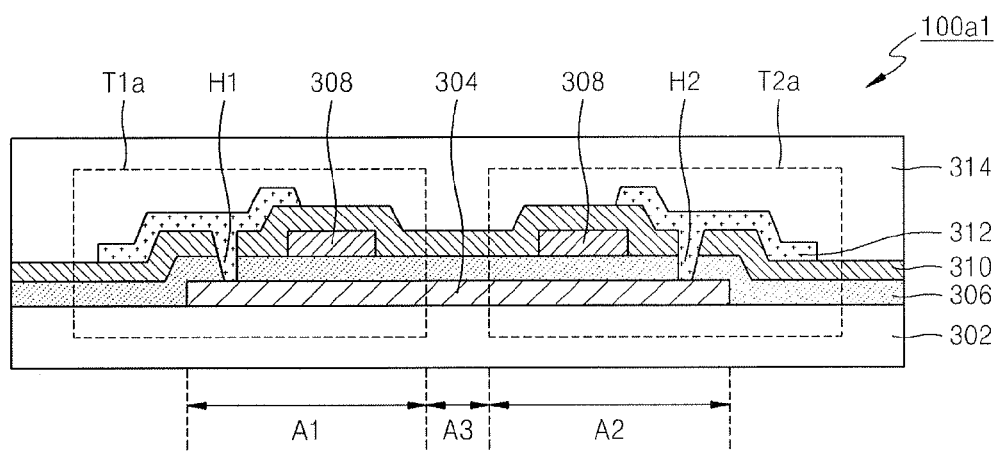
FIG. 3 illustrates a cross-sectional view of a TFT cut along a line I-I' of the TFT of FIG. 1 according to an embodiment, wherein the TFT is realized in a top gate type.

FIG. 3 illustrates a cross-sectional view of a TFT 100a1 cut along a line I-I' of the TFT 100a of FIG. 1 according to an embodiment, wherein the TFT 100a may be realized in a top gate type.

The TFT 100a1, according to the current embodiment, may be realized in a top gate type as illustrated in FIG. 3. The TFT 100a1, according to the current embodiment, may include a substrate 302, an active layer 304, a first insulating layer 306, a gate electrode layer 308, a second insulating layer 310, a source/drain electrode layer 312, and a third insulating layer 314.

The substrate 302 may be a low temperature poly silicon (LTPS) substrate, a glass substrate, a plastic substrate, or a stainless using steel (SUS) substrate.

The active layer 304 may form a channel of the TFT 100a1. The active layer 304 may correspond to the active layer pattern A of FIG. 1A and includes the first active layer pattern A1, the second active layer pattern A2, and the third active layer pattern A3.

The first insulating layer 306 may be formed on the active layer 304 and may insulate the active layer 304 from the gate electrode layer 308. The first insulating layer 306 may be formed of SiNx or SiOx. The first insulating layer 306 may function as a gate insulating layer of the TFT 100a1.

The gate electrode layer 308 may correspond to the gate electrode G of FIG. 1A. As described above, the gate electrode layer 308 may be patterned to intersect the first active layer pattern A1 and the second active layer pattern A2. The gate electrode layer 308 may include at least one material selected from transparent materials such as ITO, IZO, ZnO, and $In_2O_3$. Also, the gate electrode layer 308 may include at least one selected from the group consisting of Ag, Mg, Al, Pt, Pd, Au, Ni, Nd, Ir, Cr, Li, Ca, Mo, Ti, W, MoW, and Al/Cu. The gate electrode layer 308 may be formed to electrically connect to a signal line input to the gate electrode G of the TFT 100a1.

The second insulating layer 310 may be formed on the gate electrode layer 308 and may insulate the source/drain electrode layer 312 from the gate electrode layer 308. The second insulating layer 310 may be formed by spin coating using at least one organic insulating material selected from the group consisting of polyimide, polyamide, acryl resin, benzocyclobutene, and phenol resin. The second insulating layer 310 may have an appropriate thickness, for example, a thickness greater than that of the first insulating layer 306, and may function as an interlayer insulating layer between the gate electrode layer 308 and the source/drain electrode layer 312 in the TFT 100a1. The second insulating layer 310 may include not only the organic insulating material as described above but also an inorganic insulating material such as the first insulating layer 306 (e.g., inorganic materials described above for the first insulating layer 306). Also, the second insulating layer 310 may be alternately formed by an organic insulating material and an inorganic insulating material.

The source/drain electrode layer 312 may be formed on the second insulating layer 310 and may function as a source/drain electrode of the TFT 100a1. The source/drain electrode layer 312 may correspond to a source/drain (S/D) terminal and a drain/source (D/S) terminal of FIGS. 2A through 2D. The source/drain electrode layer 312 may contact a source/drain area of the active layer 304 through a first contact hole H1 and a second contact hole H2 formed to penetrate the first insulating layer 306 and the second insulating layer 310. The source/drain electrode layer 312 may include the same conductive material as that of the gate electrode layer 308. However, embodiments are not limited thereto and the source/drain electrode layer 312 may include various conductive materials.

The third insulating layer 314 may be formed on the source/drain electrode layer 312 and may function as a passivation layer. The third insulating layer 314 may include an inorganic material such as SiNx or SiOx.

Accordingly, the TFT 100a1, in which a first transistor T1a and a second transistor T2a are connected in series, may be formed.

Figure 4:
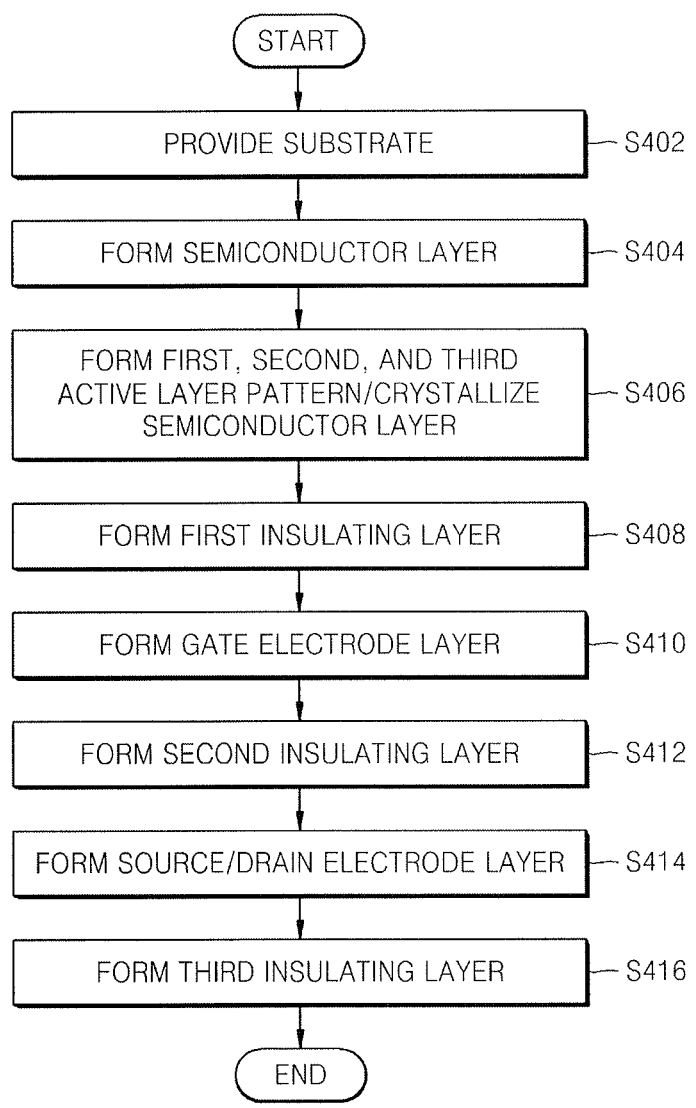
FIG. 4 illustrates a flowchart of a method of manufacturing the TFT of FIG. 3.

FIG. 4 illustrates a flowchart of a method of manufacturing the TFT 100a1 of FIG. 3.

First, the substrate 302 may be disposed, as indicated in operation S402. A semiconductor layer may be formed on the substrate 302, as indicated in operation S404. The semiconductor layer may be deposited using various deposition methods, such as chemical vapor deposition (CVD), Photo CVD, hydrogen radical (HR) CVD, electron cyclotron resonance (ECR) CVD, plasma enhanced (PE) CVD, or low pressure (LP) CVD.

Before the semiconductor layer is deposited on the substrate 302, an insulating layer (not illustrated) such as a barrier layer and/or a buffer layer may be formed on the substrate 302, in order to prevent impurity ion from being diffused on the substrate 302, prevent penetration of moisture or the outside air, and to planarize the surface. The insulating layer (not illustrated) may be deposited using $SiO_2$ and/or SiNx, by using various deposition methods, such as plasma enhanced chemical vapor deposition (PECVD), atmospheric pressure CVD (APCVD), or low pressure CVD (LPCVD).

Then, the semiconductor layer may be patterned according to the shapes of the first, second, and third active layer patterns (A1, A2, and A3) and the semiconductor layer may be crystallized so as to form the active layer pattern A, as indicated in operation S406. According to some embodiments, the patterning process may be followed by the crystallizing process. According to some embodiments, the crystallizing process may be followed by the patterning process.

The semiconductor layer may be patterned using photolithography.

The semiconductor layer may be crystallized using various methods, such as rapid thermal annealing (RTA), solid phase crystallization (SPC), excimer laser annealing (ELA), metal induced crystallization (MIC), metal induced lateral crystallization (MILC), sequential lateral solidification (SLS), or advanced sequential lateral solidification (ASLS). Due to crystallization, the semiconductor layer may be crystallized as polycrystalline silicon.

Due to patterning and crystallizing of the semiconductor layer, the active layer 304 may be formed.

Then, the first insulating layer 306 may be formed on the active layer 304, as indicated in operation S408. The first insulating layer 306 may be formed on the substrate 302, on which the active layer 304 is formed, by depositing an inorganic insulating material such as SiNx or SiOx using PECVD, APCVD, or LPCVD.

Then, the gate electrode layer 308 may be formed on the first insulating layer 306, as indicated in operation S410. The gate electrode layer 308 may be formed by depositing a material for forming the gate electrode layer 308 on the first insulating layer 306 and patterning the material.

Then, the second insulating layer 310 may be formed on the gate electrode layer 308, as indicated in operation S412. The second insulating layer 310 may be formed by depositing a material for forming the second insulating layer 310 on the substrate 302, on which the first insulating layer 306 and the gate electrode layer 308 are formed.

Then, the first contact hole H1 and the second contact hole H2, which penetrate the first insulating layer 306 and the second insulating layer 310, and the source/drain electrode layer 312 may be formed, as indicated in operation S414. The source/drain electrode layer 312 may be formed by depositing a conductive material for forming the source/drain electrode layer 312 on the second insulating layer 310 and then patterning the conductive material. Here, the conductive material for forming the source/drain electrode layer 312 may be deposited to have an appropriate thickness so as to fill the first contact hole H1 and the second contact hole H2.

Then, a material for forming the third insulating layer 314 may be formed on the substrate 302, on which the source/drain electrode layer 312 and the second insulating layer 310 may be formed. Thus, the third insulating layer 314 may be formed, as indicated in operation S416. The material for forming the third insulating layer 314 may be deposited by using PECVD, APCVD, or LPCVD.

Figure 5:
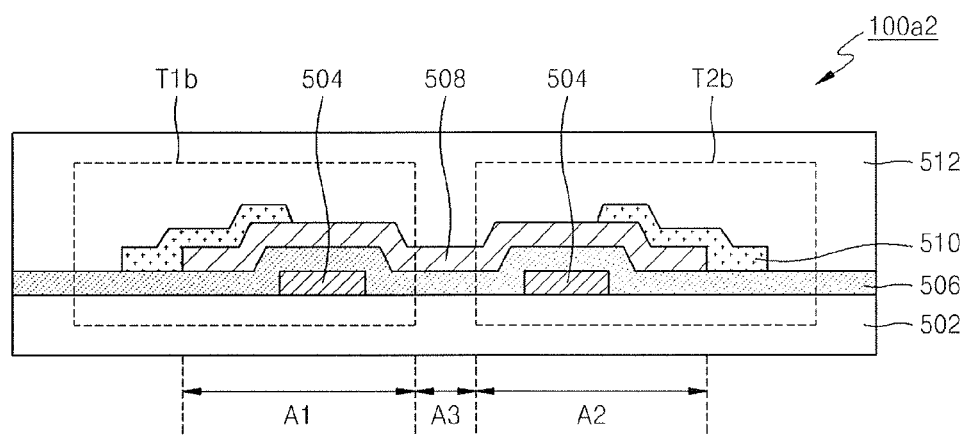
FIG. 5 illustrates a cross-sectional view of a TFT cut along a line I-I' of the TFT of FIG. 1 according to an embodiment, wherein the TFT is realized in a bottom gate type.

FIG. 5 illustrates a cross-sectional view of a TFT 100a2 cut along a line I-I' of the TFT 100a of FIG. 1, according to an embodiment, wherein the TFT of FIG. 5 is realized in a bottom gate type.

The TFT 100a2, according to the current embodiment, may be realized in a bottom gate type, as illustrated in FIG. 5. The TFT 100a2, according to the current embodiment, may include a substrate 502, a gate electrode layer 504, a first insulating layer 506, an active layer 508, a source/drain electrode layer 510, and a second insulating layer 512.

The substrate 502 may be a LTPS substrate, a glass substrate, a plastic substrate, or a SUS substrate.

The gate electrode layer 504 may correspond to the gate electrode G of FIG. 1A. For example, as described above, the gate electrode layer 504 may be patterned to intersect the first active layer pattern A1 and the second active layer pattern A2. The gate electrode layer 504 may include at least one material selected from transparent materials such as ITO, IZO, ZnO, and In2O3. Also, the gate electrode layer 504 may include at least one material selected from the group consisting of Ag, Mg, Al, Pt, Pd, Au, Ni, Nd, Ir, Cr, Li, Ca, Mo, Ti, W, MoW, and Al/Cu. The gate electrode layer 504 may be formed to electrically connect to a signal line input to the gate electrode G of the TFT 100a2.

The first insulating layer 506 may be formed on the gate electrode layer 504 and may insulate the active layer 508 from the gate electrode layer 504. The first insulating layer 506 may be formed of SiNx or SiOx. The first insulating layer 506 may function as a gate insulating layer of the TFT 100a2.

The active layer 508 may be disposed on the first insulating layer 506 and may form a channel of the TFT 100a2. The active layer 508 may correspond to the active layer pattern A of FIG. 1A and may include the first active layer pattern A1, the second active layer pattern A2, and the third active layer pattern A3.

The source/drain electrode layer 510 may be formed on the active layer 508 and functions as a source/drain electrode of the TFT 100a2. The source/drain electrode layer 510 may correspond to the source/drain (S/D) terminal and the drain/source (D/S) terminal of FIGS. 2A through 2D. The source/drain electrode layer 510 may contact a source/drain area of the active layer 508. The source/drain electrode layer 510 may include a conductive material that is same as that of the gate electrode layer 504. However, embodiments are not limited thereto and the source/drain electrode layer 510 may include various conductive materials.

The second insulating layer 512 may be formed on the source/drain electrode layer 510 and functions as a passivation layer. The second insulating layer 512 may include an inorganic material such as SiNx or SiOx.

Accordingly, the TFT 100a2, in which a first transistor T1b and a second transistor T2b are connected in series, may be formed.

Figure 6:
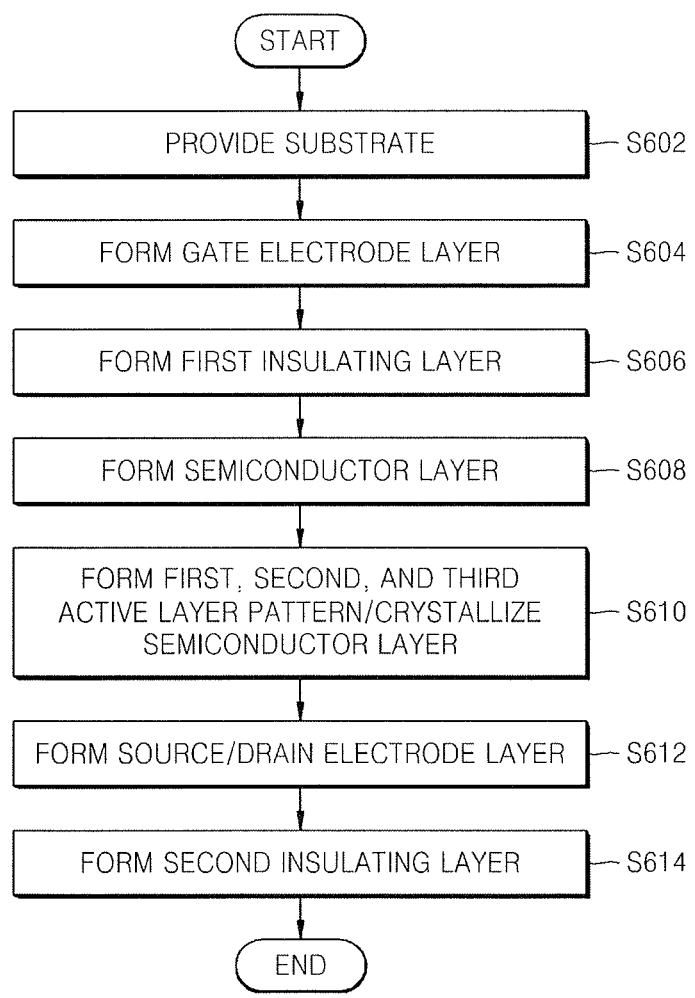
FIG. 6 illustrates a flowchart of a method of manufacturing the TFT of FIG. 5.

FIG. 6 illustrates a flowchart of a method of manufacturing the TFT 100a2 of FIG. 5.

Firstly, the substrate 502 may be provided, as indicated in operation S602. The gate electrode layer 504 may be formed on the substrate 502, as indicated in operation S604. The gate electrode layer 504 may be formed by depositing a material for forming the gate electrode layer 504 on the substrate 502 and then patterning the material.

As described above with reference to FIG. 4, before the gate electrode layer 504 may be formed on the substrate 502, an insulating layer (not illustrated), such as a barrier layer and/or a buffer layer, may be formed on the substrate 502, in order to prevent impurity ions from being diffused on the substrate 502, to prevent penetration of moisture or outside air, and to planarize the surface.

Then, the first insulating layer 506 may be formed on the gate electrode layer 504, as indicated in operation S606. The first insulating layer 506 may be formed by depositing a material for forming the first insulating layer 506 on the substrate 502, on which the gate electrode layer 504 is formed.

Then, a semiconductor layer may be formed on the first insulating layer 506, as indicated in operation 5608. The semiconductor layer may be deposited by using CVD, photo CVD, HR CVD, ECR CVD, PE CVD, or LP CVD. Also, the semiconductor layer may be formed as an amorphous silicon layer.

Then, the semiconductor layer may be patterned according to the shapes of the first, second, and third active layer patterns (A1, A2, and A3) and the semiconductor layer may be crystallized so as to form the active layer pattern A, as indicated in operation 5610. According to some embodiments, the patterning process may be followed by the crystallizing process. According to some embodiments, the crystallizing process may be followed by the patterning process.

Due to the patterning and crystallizing of the semiconductor layer, the active layer 508 may be formed.

Then, the source/drain electrode layer 510 may be formed on the active layer 508, as indicated in operation 5612. The source/drain electrode layer 510 may be formed by depositing a conductive material for forming the source/drain electrode layer 510 on the active layer 508 and the first insulating layer 506 and patterning the material.

Then, the second insulating layer 512 may be formed by depositing a material for forming the second insulating layer 512 on the substrate 502, on which the source/drain electrode layer 510 and the first insulating layer 506 may be formed, as indicated in operation 5614. The material for forming the second insulating layer 512 may be deposited by using PECVD, APCVD, or LPCVD.

Figure 7:
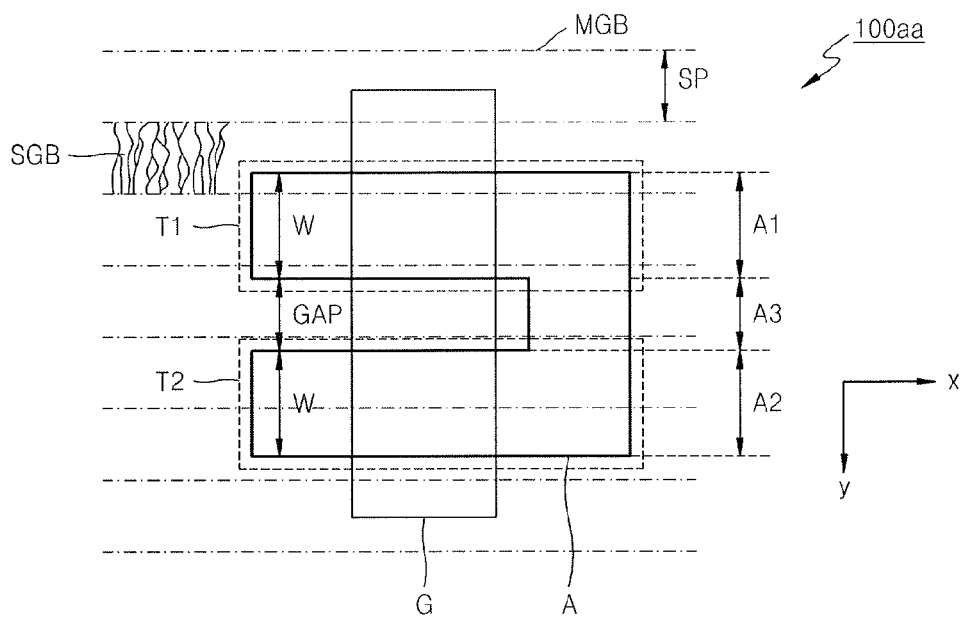
FIG. 7 illustrates an arrangement of an active layer pattern A in an example where striped main grain boundaries (MGBs) appear on an active layer according to an embodiment.

FIG. 7 illustrates an arrangement of the active layer pattern A in an example where striped main grain boundaries MGBs appear on an active layer, according to an embodiment.

According to the current embodiment, when the striped main grain boundaries MGBs are regularly repeated on the semiconductor layer (e.g., when a plurality of the main grain boundaries MGMs are evenly distributed on the semiconductor layer) and extend in the first direction x, the first active layer pattern A1 and the second active layer pattern A2 may extend in the first direction x and the gate electrode G may extend in the second direction y that is perpendicular to the first direction x. A TFT 100aa, as used herein, refers to a vertical compensating structure. The MGBs, which may periodically appear, may be spaced apart from each other by a scan pitch SP. For example, adjacent MGBs may be evenly spaced apart or disposed at regular intervals corresponding to a scan pitch SP.

According to the current embodiment, a gap GAP may be provided between the first active pattern A1 and the second active pattern A2. The gap GAP may be the same as the scan pitch SP or may be an integer time of the scan pitch SP. Also, widths W of the first active layer pattern A1 and the second active layer pattern A2 may each be the same as or larger than the scan pitch SP.

When the semiconductor layer is crystallized by using SLS, ASLS, or ELA, grain boundaries may be generated while irradiating with a laser beam. The generated grain boundaries may include main grain boundaries MGB and sub-grain boundaries SGB. The sub-grain boundaries SGB may be generated throughout the semiconductor layer in a significantly smaller scale. Thus, the sub-grain boundaries SGB may not be main factors of a property dispersion between TFTs. The main grain boundaries MGBs may be generated at a boundary of a laser beam and may appear in the form of a protrusion. However, a property of a TFT, for example, carrier mobility, may significantly vary according to the existence of the main grain boundaries MGBs in the active layer pattern A in the TFT. Accordingly, the main grain boundaries MGBs, in general, may be main factors of a property dispersion of the TFTs.

When ASLS is used, main grain boundaries MGBs, having a scan pitch SP of few micrometers, may be generated. In this case, it may be difficult to avoid generating the main grain boundaries MGBs ranging or extending over a channel area of a TFT. When ELA is used, main grain boundaries MGBs having a scan pitch SP of few hundred micrometers may be generated. In this case, a TFT may be generated throughout a substrate. Thus, the main grain boundaries MGBs may range or extend over a channel area of the TFT. In embodiments, a property dispersion of TFTs may be reduced even if locations of the TFTs are not aligned, based on the location of the main grain boundaries MGBs. Thus, an arrangement of a location of TFT may not be restricted.

In the vertical compensating structure, according to embodiments, a dispersion may be improved by adjusting the number of the main grain boundaries MGBs held in channels of the first transistor T1 and the second transistor T2. In FIG. 7, two main grain boundaries MGBs may be held in the first active layer pattern A1 that corresponds to the first transistor T1, and one main grain boundary MGB may be held in the second active layer pattern A2 that corresponds to the second transistor T2. Thus, the property of the TFT 100aa may be determined according to the property of the first transistor T1 holding two main grain boundaries MGBs. Here, a gap GAP between the first active layer pattern A1 and the second active layer pattern A2 may be an integer time of the scan pitch SP so that one main grain boundary MGB may be held in one of the first active layer pattern A1s and the second active layer patterns A2 and two main grain boundaries MGBs may be held in another one of the first active layer patterns A1 and the second active layer patterns A2. Accordingly, TFTs formed on the same substrate may be standardized by the property of a TFT holding two main grain boundaries MGBs and a property dispersion may be improved.

If the widths W of the first active layer pattern A1 and the second active layer pattern A2 increase and the number of main grain boundaries MGBs held in the first active layer patterns A1 or the second active layer patterns A2 increase, the property of the TFT may be determined by one of the first active layer patterns A1 and the second active layer patterns A2, which holds a greater number of main grain boundaries MGBs. All TFTs formed on the same substrate may be standardized by the property of one of the first active layer pattern A1 and the second active layer pattern A2 which holds a greater number of main grain boundaries MGBs. Thus, the property dispersion of the TFTs 100aa may be improved.

Figure 8:
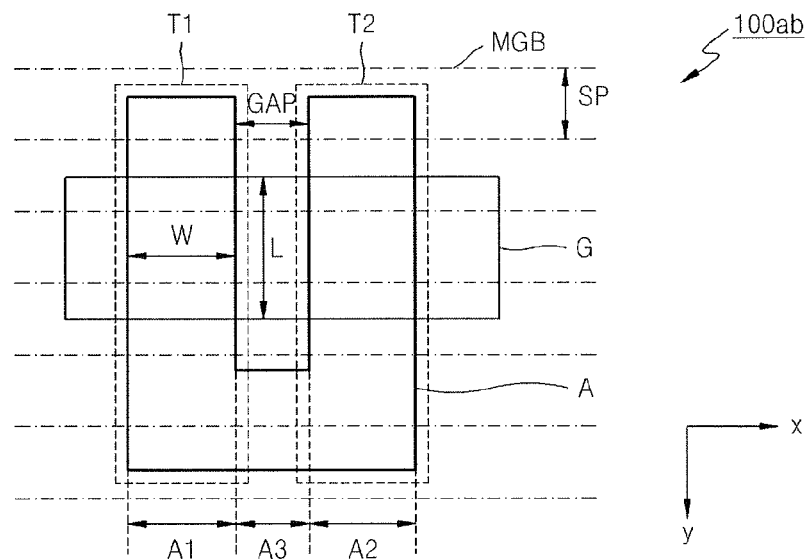
FIG. 8 illustrates an arrangement of an active layer pattern A in an example where striped MGBs appear on an active layer according to another embodiment.

FIG. 8 illustrates an arrangement of the active layer pattern A in an example where striped MGBs appear on an active layer according to another embodiment.

According to the current embodiment, in an example where the striped main grain boundaries MGBs are disposed at regular intervals on the semiconductor layer and extend in the first direction x, the first active layer pattern A1 and the second active layer pattern A2 may extend in the second direction y and the gate electrode G may extend in the first direction x. A TFT 100ab, as used herein, refers to a horizontal compensating structure. The MGBs may be repeated by spacing apart from each other by a scan pitch SP. For example, adjacent MGBs may be evenly spaced apart or disposed at regular intervals corresponding to a scan pitch SP.

According to the current embodiment, channel lengths L of the first active layer pattern A1 and the second active layer pattern A2 may be larger than the scan pitch SP.

In the horizontal compensating structure, locations of held main grain boundaries MGB in a channel in terms of distances from source/drain may be different from each other in the first transistor T1 and the second transistor T2. Thus, the property of the TFT 100ab may be determined by the first transistor T1 or the second transistor T2, in which the main grain boundaries MGB exist near a drain electrode. For example, referring to FIG. 8, when the upper end of the first active layer pattern A1 corresponds to a source of the first transistor T1 and the upper end of the second active layer pattern A2 corresponds to a drain of the second transistor T2, the main grain boundary MGB may be close to the source in the first transistor T1 and close to the drain in the second transistor T2. In general, in a TFT, a device characteristic such as carrier mobility may be deteriorated when the main grain boundary MGB is close to a drain, instead of a source. In the current embodiment, a first transistor T1 or a second transistor T2, even though the main grain boundary MGB may be close to a drain a device characteristic of the TFT 100ab may be determined and a property dispersion may be improved.

Figure 9:
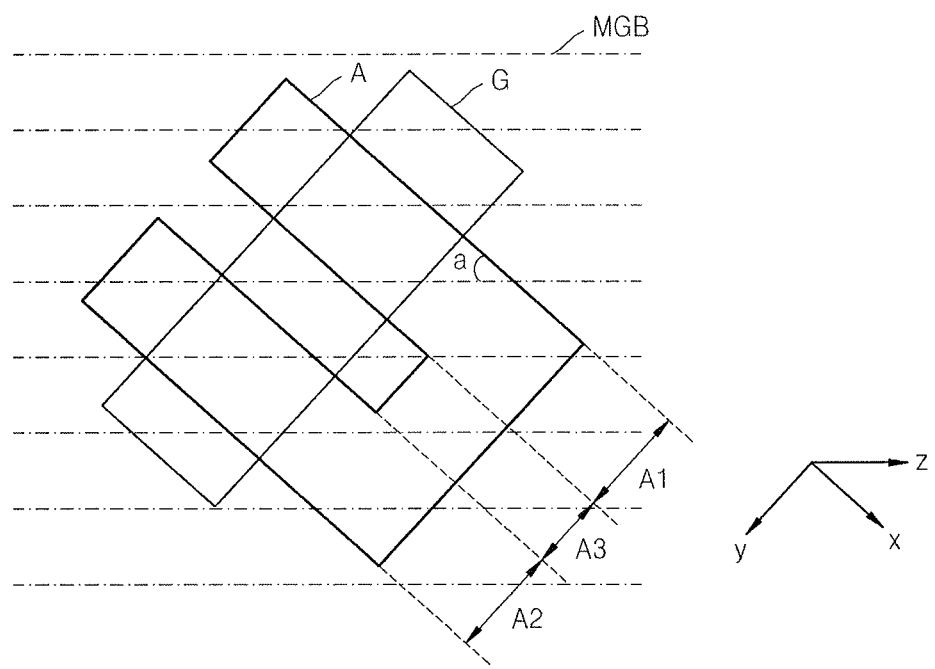
FIG. 9 illustrates an arrangement of an active layer pattern A in an example where striped MGBs appear on an active layer according to another embodiment.

FIG. 9 illustrates an arrangement of the active layer pattern A in which striped MGBs appear on an active layer according to another embodiment.

According to the current embodiment, when the striped main grain boundaries MGBs are regularly repeated on the semiconductor layer and extend in a third direction z, the first active layer pattern A1 and the second active layer pattern A2 may extend in the first direction x and the gate electrode G may extend in the second direction y that is perpendicular to the first direction x. Here, the first direction x may extend at an angle a relative to the third direction z.

Comparing the vertical compensating structure and the horizontal compensating structure, according to embodiments, carrier mobility may be excellent in the horizontal compensating structure and dispersion improvement effect may be excellent in the vertical compensating structure. In another embodiment, an angle a may be defined to obtain the desired device characteristics. The angle a may be determined to be, for example, $0°<a\leq 45°$.

Figure 10:
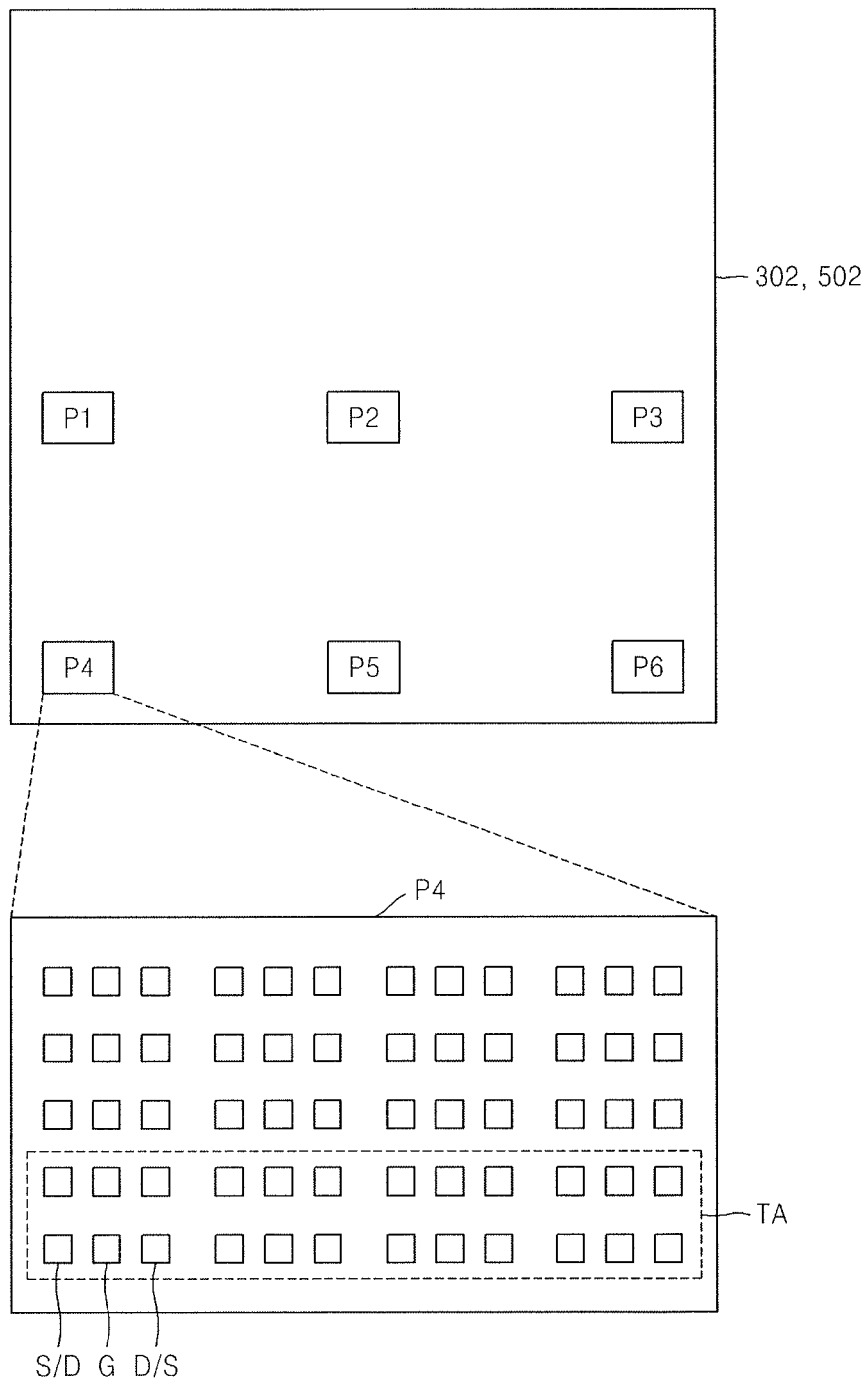
FIG. 10 illustrates a diagram of a method of measuring dispersion improvement effect according to an embodiment.
Figure 11B:
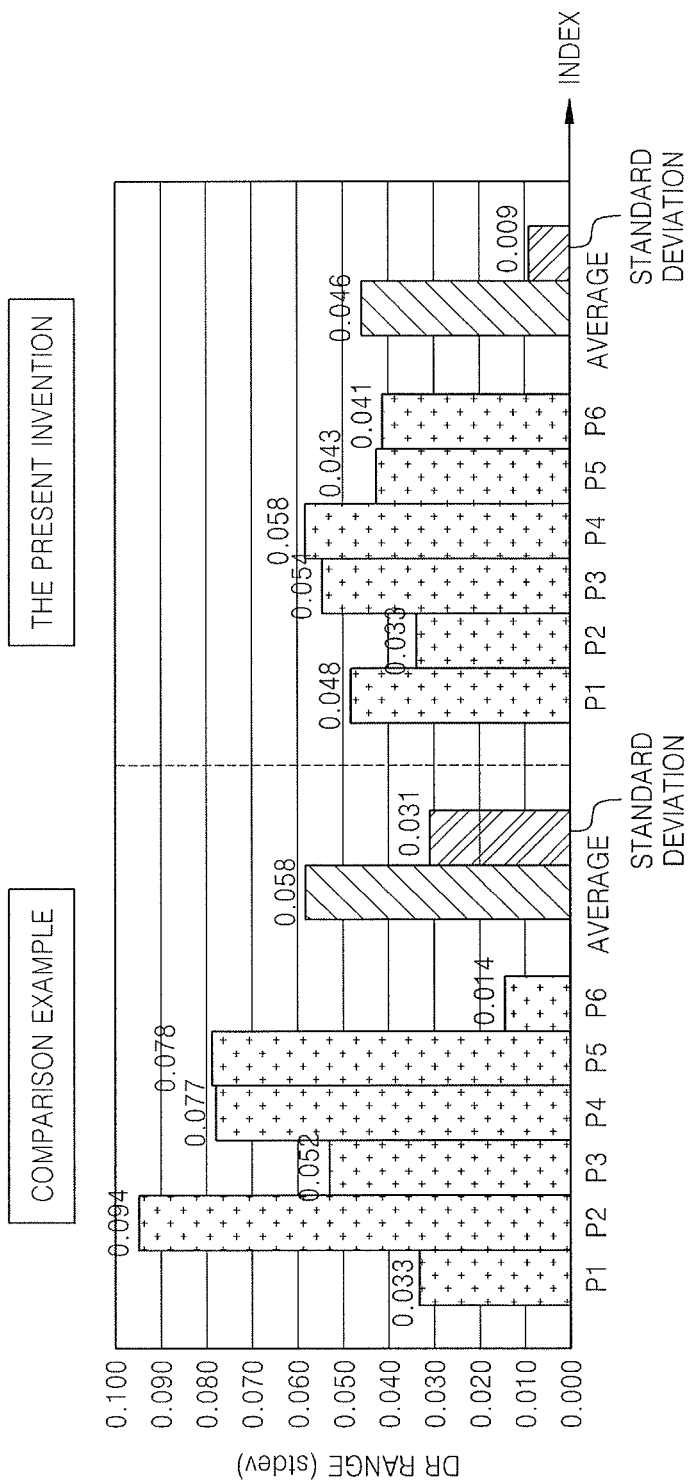

FIG. 10 illustrates a diagram of a method of measuring dispersion improvement effect, according to an embodiment and FIGS. 11A and 11B illustrate a table and a graph, respectively, relating to dispersion improvement effect according to embodiments.

In order to measure the dispersion improvement effect of TFTs according to embodiments, driving ranges DR of TFTs may be measured in six areas P1, P2, P3, P4, P5, and P6 in substrates 302 and 502, on which TFTs are formed. Here, the DR may indicate a difference between a first gate voltage, in which a current of 1 nA between drain and source is measured in the TFT, and a second gate voltage, in which a current of 500 nA between drain and source is measured in the TFT. It is desirable that TFTs generated having the same device parameters, for example, W/L parameters, on one substrate have a regular DR.

In order to measure the effect of the TFTs according to embodiments, DR of 8 adjacent TFTs in each test area TA in the areas P1 through P6 were measured with respect to a substrate, on which TFTs generated according to an embodiment were formed, and a comparison substrate, on which TFTs generated according to conventional methods were formed. Thus, 8 device dispersions were measured and the results are illustrated in FIGS. 11A and 11B. In the comparison example, a dispersion of a TFT in a top gate structure having a W/L value of 6 um/27 um in DR was measured. In the TFTs according to one or more embodiments, a dispersion of a TFT having a vertical compensating structure as in FIG. 7, in which the first transistor T1 having a W/L value of 6 um/13.5 um and the second transistor T2 are connected, in DR was measured. As illustrated in Table of FIG. 11A, when the TFTs according to one or more embodiments was applied, an average of dispersions of 8 TFTs in each area decreased from 0.058 to 0.046 and a standard deviation for dispersions in 6 areas decreased from 0.031 to 0.009. FIG. 11B illustrates a graph of the data of FIG. 11A, which shows that dispersions in 6 areas are significantly decreased and the standard deviation thereof is significantly decreased.

Figure 12:
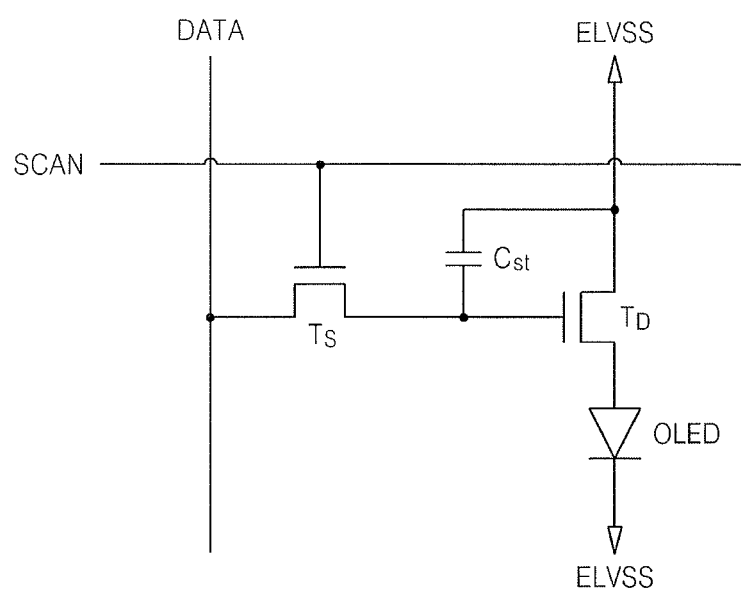
FIG. 12 illustrates a diagram of a TFT according to an embodiment applied to an organic light emitting display apparatus.

FIG. 12 illustrates a diagram of a TFT, according to an embodiment, applied to an organic light emitting display apparatus.

The TFTs, according to embodiments, may be applied to a pixel circuit of an organic light emitting display apparatus. As illustrated in FIG. 12, the pixel circuit of the organic light emitting display apparatus may include a scan transistor Ts, a driving transistor TD, a storage capacitor Cst, and an organic light emitting diode OLED. In the organic light emitting display apparatus, when a scan pulse is input to a gate terminal of the scan transistor Ts through a scan signal line SCAN, a data signal may be input to a gate terminal of the driving transistor TD through a scan transistor Ts, and a driving current may be generated in the driving transistor TD according to a voltage level of the data signal, so that the driving current is applied to the organic light emitting diode OLED. The organic light emitting diode OLED may emit light having brightness according to the intensity of the driving current. However, when the property of the driving transistor TD varies in each pixel, a response characteristic of the driving transistor TD for the data signal varies. Thus, image quality may be deteriorated. According to the current embodiment, the TFT may be applied to a driving transistor TD of each pixel of the organic light emitting display apparatus and image quality deterioration due to a property dispersion of the driving transistor TD may be significantly reduced.

Also, the organic light emitting display apparatus may have various pixel circuit structures other than the structure illustrated in FIG. 12. The TFTs, according to the embodiments, may be applied to a part or all of the TFT included in a pixel circuit.

In addition, the organic light emitting display apparatus may include various driving circuits, including a data driving circuit, a gate driving circuit, and a timing control circuit, and the TFTs, according to the embodiments, may be applied to TFTs included in the driving circuits.

The TFTs, according to the embodiments, may be applied to various types of display apparatuses such as a liquid crystal display apparatus, a plasma display panel (PDP), and electroluminescent display apparatus, in addition to the organic light emitting display apparatus. Also, the TFTs, according to the embodiments, may be applied to various fields such as a semiconductor memory device, an integrated circuit, and the like.

According to embodiments, a property dispersion of a TFT may be significantly reduced by grain boundaries generated during crystallization.

While the embodiments have been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film transistor (TFT) comprising:
   an active layer pattern, wherein the active layer pattern includes
      a first active layer pattern extending in a first direction;
      a second active layer pattern extending in the first direction and parallel to the first active layer pattern;
      a third active layer pattern connecting a first end of the first active layer pattern to a first end of the second active layer pattern; and
      a plurality of linear grain boundaries extending in a third direction, adjacent grain boundaries having a gap therebetween, the gap corresponding to a scan pitch,
   wherein gaps between the first active layer pattern and the second active layer pattern are the same as the scan pitch or are an integer time of the scan pitch.

2. The TFT of claim 1, further comprising:
   a gate electrode extending in a second direction, the second direction being perpendicular to the first direction, the gate electrode intersecting the first active layer pattern and the second active layer pattern; and
   a gate insulating layer interposed between the active layer pattern and the gate electrode.

3. The TFT of claim 1, wherein the first direction is a direction parallel to the third direction and the second direction is a direction perpendicular to the third direction.

4. The TFT of claim 1, wherein the first direction is a direction perpendicular to the third direction and the second direction is a direction parallel to the third direction.

5. The TFT of claim 1, wherein the first direction extends at an angle "a" relative to the third direction, "a" satisfying the relation $0°<a\leq 45°$.

6. The TFT of claim 1, wherein widths of the first active layer pattern and the second active layer pattern are each longer than the scan pitch.

7. The TFT of claim 1, wherein:
   the first active layer pattern includes a plurality of first active layer patterns,
   the second active layer pattern includes a plurality of second active layer patterns,
   the third active layer pattern includes a plurality of third active layer patterns, each of the third active layer patterns connecting the first end of the first active layer patterns to the first end of one adjacent second active layer pattern,
   the active layer pattern further includes a fourth active layer pattern, the fourth active layer pattern connecting a second end of the first active layer patterns to a second end of another adjacent second active layer pattern.

8. The TFT of claim 7, further comprising:
   a gate electrode extending in the second direction and intersecting the plurality of first active layer patterns and the plurality of second active layer patterns; and
   a gate insulating layer interposed between the active layer pattern and the gate electrode.

9. The TFT of claim 1, wherein the active layer pattern is crystallized by using at least one selected from the group consisting of rapid thermal annealing (RTA), solid phase crystallization (SPC), excimer laser annealing (ELA), metal induced crystallization (MIC), metal induced lateral crystallization (MILC), sequential lateral solidification (SLS), and advanced sequential lateral solidification (ASLS).

10. An organic light emitting display apparatus comprising:
    an organic light emitting diode for emitting light by receiving a driving current; and
    a plurality of pixels having a driving transistor for generating the driving current in response to a data signal, wherein the driving transistor is a thin film transistor (TFT) as claimed in claim 1.

11. The apparatus of claim 10, wherein the driving transistor includes:
    a gate electrode extending in a second direction, the second direction being perpendicular to the first direction and intersecting the first active layer pattern and the second active layer pattern; and
    a gate insulating layer interposed between the active layer pattern and the gate electrode.

12. The apparatus of claim 10, wherein widths of the first active layer pattern and the second active layer pattern are each longer than the scan pitch.

13. The apparatus of claim 10, wherein:
    the first active layer pattern includes a plurality of first active layer patterns,
    the second active layer pattern includes a plurality of second active layer patterns,
    the third active layer pattern includes a plurality of third active layer patterns, each of the third active layer patterns connecting the first end of the first active layer patterns to the first end of one adjacent second active layer pattern, the active layer pattern further includes a fourth active layer pattern, the fourth active layer pattern connecting a second end of the first active layer patterns to a second end of another adjacent second active layer pattern.

14. The apparatus of claim 13, wherein the driving transistor includes:
a gate electrode extending in the second direction and intersecting the plurality of first active layer patterns and the plurality of second active layer patterns; and
a gate insulating layer interposed between the active layer pattern and the gate electrode.

15. A method of manufacturing a thin film transistor (TFT), the method comprising:
forming a semiconductor layer;
forming a first active layer pattern, a second active layer pattern and a third active layer pattern by patterning the semiconductor layer; and
crystallizing the semiconductor layer before or after forming of the first, second and third active layer patterns,
wherein the first active layer pattern extends in a first direction, the second active layer pattern extends in the first direction and parallel to the first active layer pattern, and the third active layer pattern connects a first end of the first active layer pattern to a first end of the second active layer pattern,
wherein the semiconductor layer includes a plurality of linear grain boundaries extending in a third direction, and adjacent grain boundaries have a gap therebetween, the gap corresponding to a scan pitch, and
wherein gaps between the first active layer pattern and the second active layer pattern are the same as the scan pitch or are an integer time of the scan pitch.

16. The method of claim 15, further comprising:
forming a gate insulating layer on the first, second, and third active layer patterns; and
forming a gate electrode extending in a second direction, the second direction being perpendicular to the first direction, and intersecting the first active layer pattern and the second active layer pattern on the gate insulating layer.

17. The method of claim 15, wherein widths of the first active layer pattern and the second active layer pattern are each longer than the scan pitch.

18. The method of claim 15, further comprising forming a fourth active layer pattern, wherein
forming the first, second, and third active layer patterns includes forming a plurality of the first, second, and third active layer patterns,
each of the third active layer patterns connects the first end of the first active layer patterns to the first end of one adjacent second active layer pattern, and
the fourth active layer pattern connects a second end of the first active layer pattern to a second end of another adjacent second active layer pattern.

19. The method of claim 18, further comprising:
forming a gate insulating layer on the first, second, third, and fourth active layer patterns; and
forming a gate electrode extending in the second direction and intersecting the plurality of first active layer patterns and second active layer patterns on the gate insulating layer.

20. The method of claim 15, further comprising:
forming a gate electrode extending in a second direction that is perpendicular to the first direction on the substrate; and
forming a gate insulating layer on the gate electrode,
wherein forming the semiconductor layer includes forming the semiconductor layer on the gate insulating layer, and
wherein forming the first, second, and third active layer patterns includes forming the first, second, and third active layer patterns for gate electrode to intersect the first active layer pattern and the second active layer pattern.

21. The method of claim 15, wherein the first direction is a direction parallel to the third direction and the second direction is a direction perpendicular to the third direction.

22. The method of claim 15, wherein the first direction is a direction perpendicular to the third direction and the second direction is a direction parallel to the third direction.

23. The method of claim 15, wherein the first direction extends at an angle "a" relative to the third direction, "a" satisfying the relation $0° < a \leq 45°$.

* * * * *